United States Patent [19]

Speiser et al.

[11] 4,152,772
[45] May 1, 1979

[54] APPARATUS FOR PERFORMING A DISCRETE COSINE TRANSFORM OF AN INPUT SIGNAL

[75] Inventors: Jeffrey M. Speiser; James M. Alsup, both of San Diego, Calif.

[73] Assignee: The United States of America as represented by the Secretary of the Navy, Washington, D.C.

[21] Appl. No.: 752,641

[22] Filed: Dec. 20, 1976

Related U.S. Application Data

[63] Continuation-in-part of Ser. No. 501,544, Aug. 29, 1974, abandoned.

[51] Int. Cl.² .................. G06F 15/34; G06G 7/12
[52] U.S. Cl. .................................... 364/725; 364/826
[58] Field of Search ............... 364/725, 726, 604, 826, 364/827

[56] References Cited

U.S. PATENT DOCUMENTS

| | | | |
|---|---|---|---|
| 3,900,721 | 8/1975 | Sperser et al. | 364/725 |
| 3,920,974 | 11/1975 | Means | 365/725 |
| 3,965,343 | 6/1976 | Speiser et al. | 364/726 |
| 3,971,927 | 7/1976 | Speiser et al. | 364/826 |
| 4,049,958 | 9/1977 | Hartmann | 364/725 X |

Primary Examiner—David H. Malzahn
Attorney, Agent, or Firm—Richard S. Sciascia; Ervin F. Johnston; John Stan

[57] ABSTRACT

Apparatus for performing a discrete cosine transform of an input signal, suitable for real-time television image processing, specifically for obtaining an acceptable picture when the number of bits of information available for describing the picture and/or the channel bandwidth are severely limited, comprising: two read-only memories, each containing a predetermined number of +1's and −1's arranged in a predetermined manner; two multipliers, each having an input from one of the read-only memories, and another, joint, input connectable to the input signal which is to be transformed discretely and cosinusoidally; two transversal filters, each having N taps, rather than twice the number (2N−1) of taps in the prior art discrete cosine filters, the input to each filter being the output of one of the multipliers; and a single-pole double-throw switch, which switches position at every shift of the samples through the filter, the output of the transform apparatus being connected to the switch arm, each of the free terminals of the switch being connected to the output of one of the transversal filters.

4 Claims, 6 Drawing Figures

EDCT EMBODIMENT USING SWITCHING FILTER.

GENERAL DFT IMPLEMENTED VIA A CZT USING A TRANSVERSAL FILTER.

SWITCHING FILTER FOR USE IN THE EDCT FOR
$N \equiv 0 \pmod 4$ OR $N \equiv 2 \pmod 4$.

EDCT EMBODIMENT USING SWITCHING FILTER.

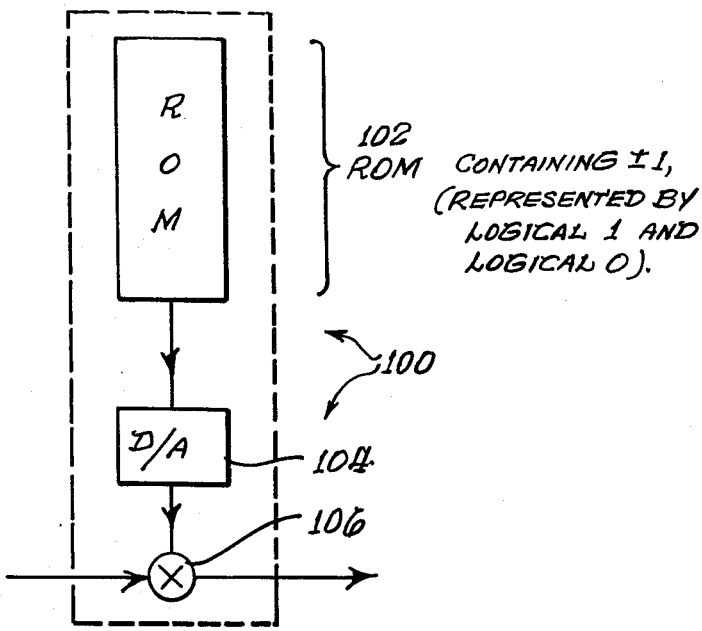
Fig. 4. DETAIL OF FIG. 2 OR FIG. 3 USING DIGITAL-TO-ANALOG CONVERTER AND ANALOG MULTIPLIER TO MULTIPLY BY PRESCRIBED SEQUENCE OF ±1.
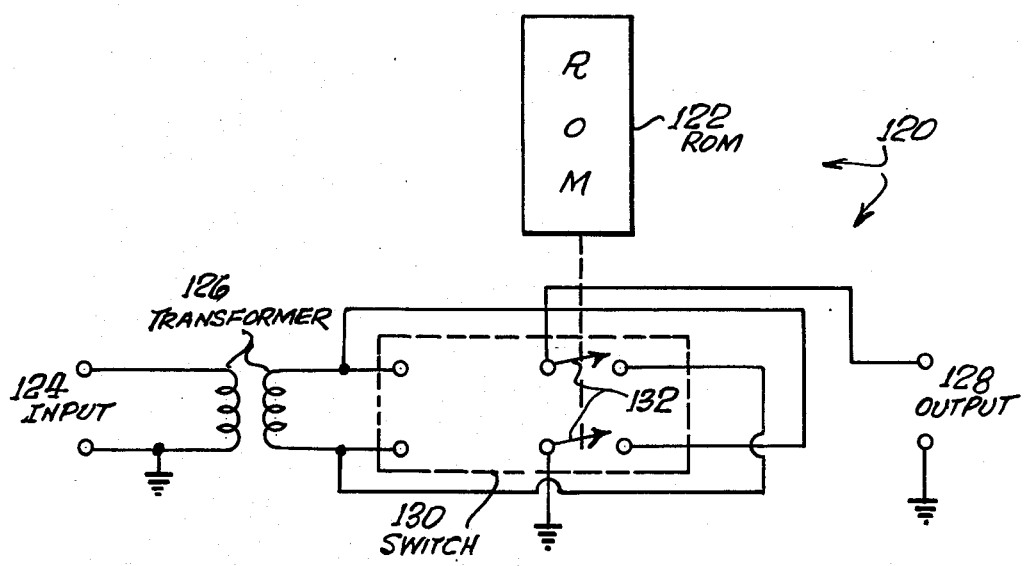
Fig. 5. ALTERNATIVE FOR DETAIL OF FIGS. 2 AND 3 USING TRANSFORMER AND SWITCHING MEANS TO MULTIPLY BY PRESCRIBED SEQUENCE OF ±1.

TRANSVERSAL FILTER DETAIL, USING FOUR-FILTER COMPLEX ARITHMETIC.

APPARATUS FOR PERFORMING A DISCRETE COSINE TRANSFORM OF AN INPUT SIGNAL

STATEMENT OF GOVERNMENT INTEREST

The invention described herein may be manufactured and used by or for the Government of the United States of America for Governmental purposes without the payment of any royalties thereon or therefor.

CROSS REFERENCE TO RELATED APPLICATION

This application is a continuation-in-part of application Ser. No. 501,544, filed Aug. 29, 1974, now abandoned.

BACKGROUND OF THE INVENTION

This invention relates to apparatus capable of performing a discrete cosine transform with light-weight, low-cost, high-speed hardware suitable for real-time television image processing.

The cosine transform is suitable for real-time television image processing, specifically for obtaining an acceptable picture when the number of bits of information available for describing the picture and/or the channel bandwidth are severely limited.

The number of bits of information in any system are always limited due to the economics of the situation. The greater the number of bits in a system the greater the cost. Or, given a certain number of bits, it is economically advantageous to have as many useable channels as possible with that given number. With the apparatus of this invention, even when the number of bits are reduced by a ratio of twelve to one, a satisfactory picture is transmitted. This means that twelve different channels, transmitting a picture having the quality of this one invention, can be transmitted with the same number of bits of information as only one channel having no data compression, as in the prior art.

Theoretical work and simulation studies have shown that the discrete cosine transform is nearly optimum for image redundancy reduction. This is discussed by Means, R. W., H. J. Whitehouse, and J. M. Speiser, REAL TIME TV IMAGE REDUNDANCY REDUCTION USING TRANSFORM TECHNIQUES, in "New Directions in Signal Processing in Communication and Control", NATO Advanced Study Institutes Series, Noordhoof-Leyden, 1975. The discrete cosine transform may be interpreted as a discrete Fourier transform of a symmetrized version of the image data block. Prior art means for performing the discrete Fourier transform, such as Fast Fourier Transform (FFT) hardware or chirp-z transform hardware may also be used to perform the discrete cosine transform. The chirp-z transform (CZT) devices are to be preferred to the FFT devices since the data block size is not restricted to be a highly composite number for the CZT, and also the CZT is about $\log_2 N$ times faster (where N is the transform block length), using components with the same operation rate. However, the size of the transform block for the CZT is limited by the number of independent taps in the transversal filter. A filter length of at least $2N-1$ taps has previously been required to implement a discrete cosine transform of an N-point data block. This invention implements a discrete cosine transform of length N using only filters with N taps, thus either reducing the filter length required or permitting a longer block to be transformed with filters of a given length.

One of the principle advantages of this invention is the ability to perform a discrete cosine transform on longer blocks with filters having a given number of taps. This will permit a higher picture quality for a given transmission bandwidth, or a reduced transmission bandwidth for a given picture quality requirement. This invention replaces a long time-invariant transversal filter by a shorter time-variant transversal filter, where the latter is composed of two (complex) short time-invariant transversal filters, together with multipliers, signal generators, and a switch.

The transversal filters of this invention may be acoustic surface wave tapped delay lines, charge transfer tapped delay lines, or other tapped delay lines, or digital correlators. Similarly, the function generators which provide the discrete chirps may be read-only memories, acoustic surface wave filters, charge transfer devices, or digital shift registers. The function generators which provide the sequences of $\pm 1$'s may be any of the aforementioned or may be digital switching circuits.

SUMMARY OF THE INVENTION

The implementation of the discrete cosine transform (DCT) by the methods of this invention provides a very close approximation to the optimum Karhunen-Loeve transform, while permitting compact, real-time implementation by a combination of multipliers and filters. The two types of DCT which are useful for reduced redundancy television image transmission are obtained by extending a length N data block to have even symmetry, taking the discrete Fourier transform (DFT) of the extended data block, and saving N terms of the DFT.

The "Odd DCT" (ODCT) extends the length N data block to length $2N-1$ and the "Even DCT" extends the length N data block to length $2N$. For example, if the data block were ABC, the two extensions would be CBABC and CBAABC, respectively. Analytic expressions for these transforms are given hereinbelow.

Three different ways of implementing a one-dimensional DCT in real time have been found, requiring filter lengths of approximately 4 N, 2 N, and N for an N-point transform. A detailed comparison is provided in Table 1 hereinbelow.

OBJECTS OF THE INVENTION

An object of the invention is to provide apparatus useful for television image transmission with reduced redundancy of the data constituting the picture elements.

Another object of the invention is to provide apparatus of the type described which uses a filter length much shorter than similar prior art devices, sometimes of only one fourth the length.

Yet another object of the invention is to provide a structure which permits a further increase in block size for a given filter length.

Other objects, advantages and novel features of the invention will become apparent from the following detailed description of the invention when considered in conjunction with the accompanying drawings wherein:

BRIEF DESCRIPTION OF THE DRAWINGS

FIG. 4 is a block diagram showing an alternative arrangement of part of FIGS. 2 and 3.

FIG. 5 is a diagram, partially in block form, using a transformer switched by a read-only memory, to multiply by a prescribed sequence of $+1$'s.

DESCRIPTION OF THE PREFERRED EMBODIMENTS

Figure 2:
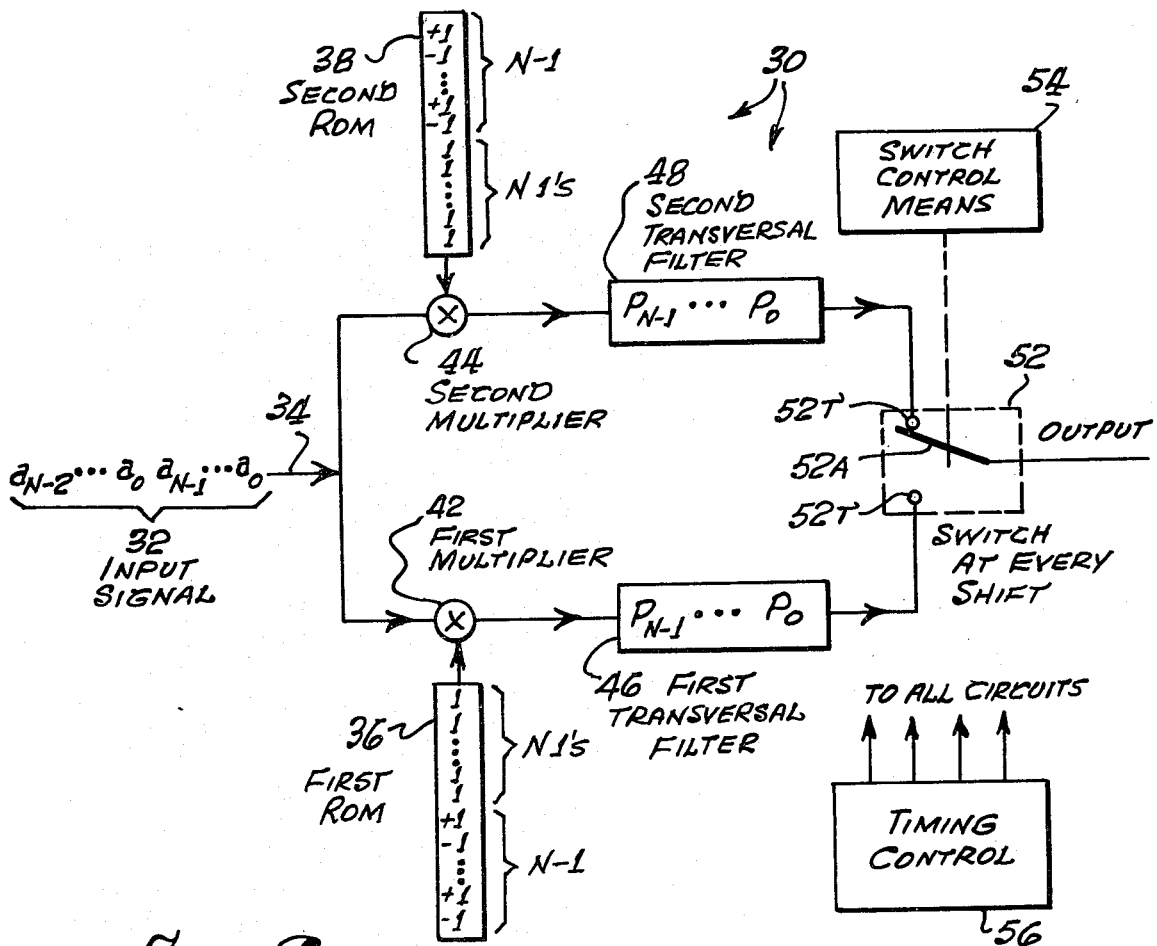
FIG. 2 is a block diagram of a switching filter for use in the even discrete cosine transform (EDCT) when the data block length is even.

Referring now to FIG. 2, therein is shown a part of apparatus 30 for performing the modified periodic convolution used in performing the discrete cosine transform of an input signal 32, having N samples, at input 34. There are N data samples in the input signal 32, which are fed into the switching filter 30 at input 34, beginning with the first sample $a_0$, and ending with the last sample $a_{N-1}$. This set of samples is fed into the input again with the exception of the last point $a_{n-1}$.

Two read-only memories, 36 and 38, each contain a total number equal to $2N-1$ of $+1$'s and $-1$'s arranged in a predetermined manner. The ROM's, 36 and 38 can be either digital ROM's followed by digital analog converters 104, as is shown by the embodiment 100, shown in FIG. 4, or they can also be transversal filters which are impulsed with a delta function, to obtain an analog readout. This is well known in the prior art.

Two multipliers, 42 and 44, each have an input from one of the read-only memories, 36 and 38, respectively, and another, common, input 34 connectable to the input signal 32 which is to be transformed discretely and cosinusoidally. Two transversal filters, 46 and 48, each have N taps, the input to each filter being the output of one of the multipliers, 42 and 44, respectively. N, the number of taps required in the filters, is equal to the block size of the transform. With present transversal filter technology, N may be as large as 256.

A single-pole double-throw switch 52 comprises a switch arm 52A and two free terminals 52T, the output of the transform apparatus 10 appearing at the switch arm. Each of the free terminals 52T are connected to the output of one of the transversal filters, 46 or 48. Means 54 are connected to the switch 52 for causing the switch arm 52A to be connected alternately first to one free terminal 52T and then to the other, until all the required input samples have been transformed.

As is shown in FIG. 2, in the apparatus 30, as the input signal 32 enters first and second multipliers, 42 and 44, then, in synchronism, one of the read-only memories 36 discharges first an N number of $+1$'s and then an $N-1$ number of alternating $\pm 1$'s, beginning with a $-1$, and the other read-only memory 38 discharges first an N number of $+1$'s and then an $N-1$ number of alternating $\pm 1$'s, beginning with a $+1$.

The information in the ROM's 36 and 38 is read out by simply sequentially generating the appropriate address words if the desired functions were sequentially stored in memory, which is the manner in which it would be commonly done. All that is required is a counter to generate the address words in the proper order, which is easily arranged, and which is old in the art.

The ROM addresses are successively indexed by 1. The effect of the $+1$'s in the ROM's, 36 and 38, is that the input signal 32 leaves the first and second multipliers, 42 and 44, unchanged. It has the same effect as if the first and second ROM's, 36 and 38, and the first and second multipliers, 42 and 44, were not present for the first N samples. The first and second transversal filters, 46 and 48, "see" only the input signal 32, $a_0$ through $a_{N-1}$, and do not "see" at all the first or second multipliers, 42 or 44, or the first or second ROM's, 36 and 38. In essence, the various components of the invention are self timed, with the understanding that the outputs from the two read-only memories, 36 and 38, are strobed at the same time that the input signal enters the multiplier, so that $a_0$ enters the multipliers, 42 and 44, with the first 1's from ROMs 36 and 38. Also, switch 52 is synchronous with the data samples.

Figure 3:
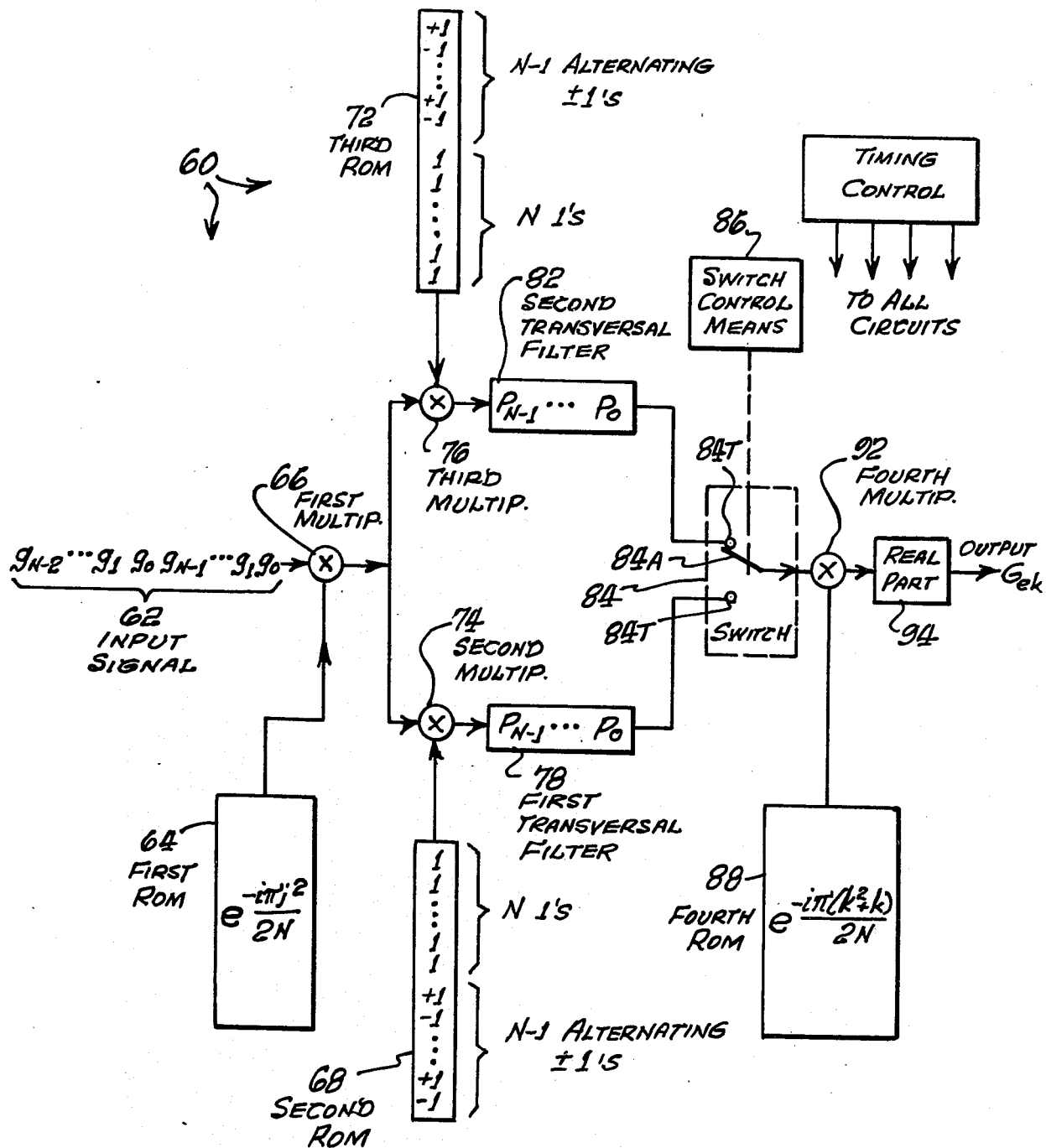
FIG. 3 is a block diagram of an EDCT embodiment using a switching filter.

Referring now to FIG. 3, therein is shown an embodiment of apparatus 60 for performing a discrete cosine transform of an input signal 62 having N samples. A first read-only memory 64 has stored within it data samples corresponding to $$e^{-i\pi j^2/2N}, j=0,1\ldots N-1.$$

A first multiplier 66 has as its two inputs an input signal, $g_{N-2}\ldots g_1 g_0\ldots g_{N-1}\ldots g_1 g_0$, labelled 62, and the output of the first read-only memory 64. Second and third read-only memories, 68 and 72, contain a predetermined number of $+1$'s and $-1$'s arranged in a predetermined manner. Second and third multipliers, 74 and 76, have as their two inputs the output of the first multiplier 66 and the outputs of the second and third read-only memories, 68 and 72, respectively.

First and second transversal filters, 78 and 82, each have N taps, the input to each filter being the output of the second or third multipliers, 74 or 76.

A single-pole double-throw switch 84 comprises a switch arm 84A and two free terminals 84T, each of the free terminals being connected to the output of one of the transversal filters, 78 and 82. Means 86 are connected to the switch 84 for causing the switch arm 84A to be connected alternately first to one free terminal 84T and then to the other until all of the required input signal bits 62 are processed.

A fourth read-only memory 88 has stored within its data samples corresponding to $$e^{-i\pi(k^2+k)/2N}, k=0, 1\ldots N-1.$$

A fourth multiplier 92 has one input connected to the switch arm 84A, the other input being connected to the output of the fourth read-only memory 88.

Means 94 are connected to the output signal of the fourth multiplier 92, for taking the real part of the signal, which comprises the discrete cosine transform of the input signal 62.

To understand the invention, one needs to know how complex multiplication, complex convolution, and transversal filtering is performed. Complex multiplying, filtering and convolving is described in U.S. Pat. No. 3,926,367, entitled COMPLEX FILTERS, CONVOLVERS AND MULTIPLIERS, to Bond et al., which issued on Dec. 16, 1975.

Figure 6:
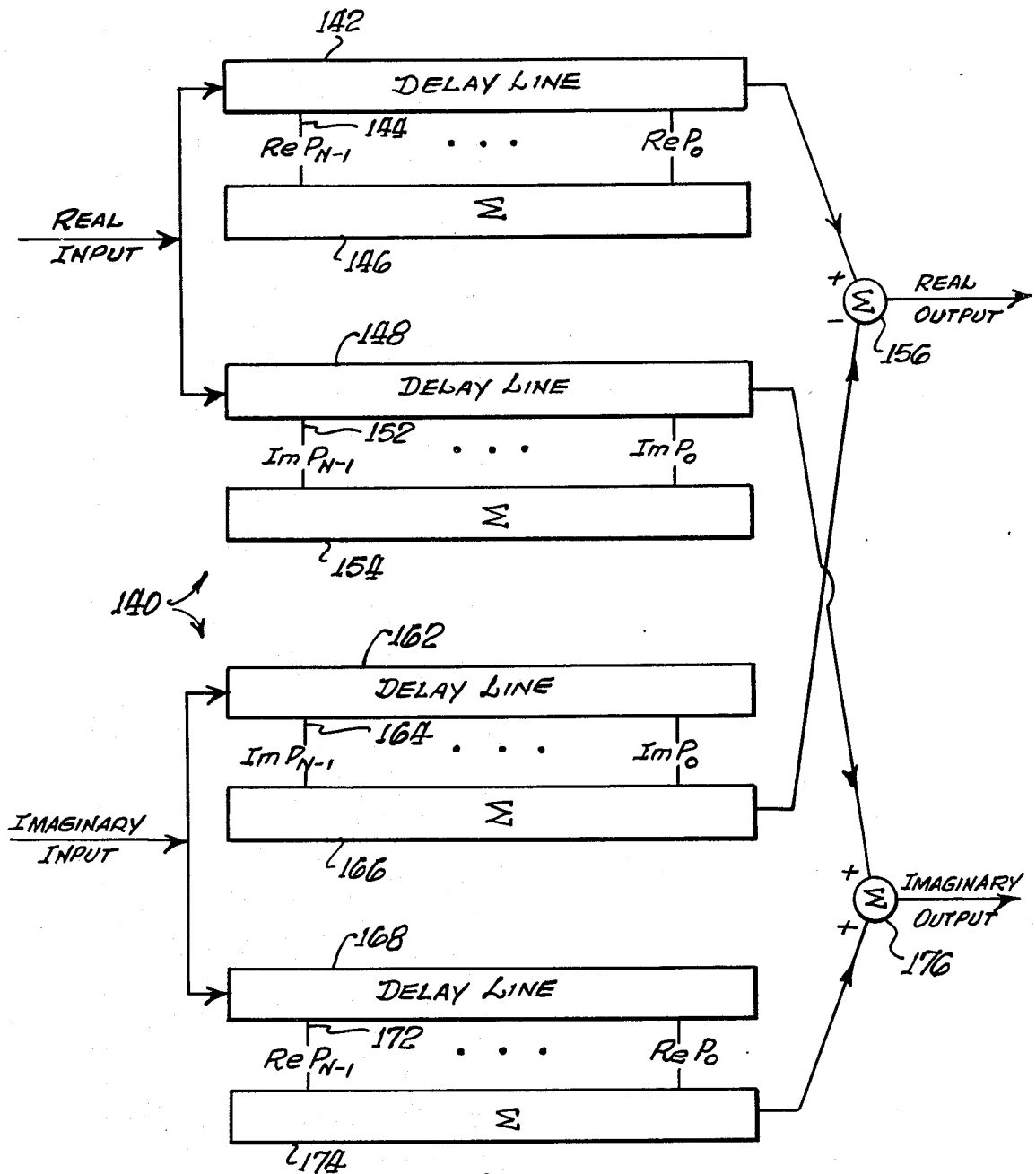
FIG. 6 is a prior art block diagram of a complex transversal filter, using four-filter complex arithmetic.

These operations are also described in detail in one of the references mentioned hereinbelow, namely, ARPA QR1, in the article beginning on page 83, entitled "High Speed Serial Access Linear Transform Implementations". A complex multiplier, comprising four real multipliers and two summers, is shown in FIG. 6, on page 90, while a complex convolver is shown in FIG. 7, on page 91. Each complex convolver or transversal filter comprises four real transversal filters. Charge-coupled transversal filters have been well documented in the prior art, as have acoustic surface-wave transversal filters.

The transversal filter used in this invention was a surface acoustic wave (SAW) device specifically designed for this application. Determination of the spacing and length of the "fingers" of the electrodes are well known in the prior art. They are discussed, for example in a paper by Tancrell, R. H., and Holland, M. G. entitled "Acoustic Surface Wave Filters", which appeared in the IEEE Proc., 59, No. 3 (March 1971), pp. 393–409.

The real multipliers used in a complex multiplier are commercially available as variable transconductance or quarter-square multipliers, if it is desired to operate at base band. A variable transconductance multiplier which may be used for the purposes of this invention is the Model 429B, manufactured by Analog Devices, Dept. G, P.O. Box 280, Norwood, Mass., 02062.

Balanced mixers could be used with signals represented on the carrier. If transversal filters are implemented as charge-coupled devices, then one would use the variable transconductance type of multiplier. If the transversal filter were an acoustic surface-wave device, where signals are represented as modulation on a carrier, then balanced mixers would be used for the multipliers. A balanced mixer which has been used as a multiplier for this invention is the Model 10534A, manufactured by the Hewlett Packard Co., 195 Page Mill Road, Palo Alto, Calif., 94036.

Prior art references with respect to the transversal filters which may be used for this invention are described in the following article: "Linear Signal Processing and Ultrasonic Transversal Filters", by Squire, W. D., Whitehouse, H. J., and Alsup, J. M., published by the IEEE Transactions on Microwave Theory and Techniques, Volume MTT-17, Number 11, November, 1969, pp. 1020–1040.

Another pertinent reference on transversal filters is: Transversal Filtering Using Charge-Transfer Devices, by Buss, D. B., Collins, D. R., Bailey, W. H., and Reeves, C. R., which appeared in VOL. SC-8, No. 2, April 1973 of the IEEE Journal of Solid-State Physics, pp. 138–146.

A read-only memory which has been used for this invention is the part No. MCM 14524AL, manufactured by MOTOROLA Semiconductor Products, Inc., Dept. G, P.O. Box 20912, Phoenix, Arizona, 85036.

Discussing now the theory behind the invention, two different types of discrete cosine transform (DCT) are useful for reduced redundancy televsion image transmission. Both are obtained by extending a length N data block to have even symmetry, taking the discrete Fourier transform (DFT) of the extended data block, and saving N terms of the resulting DFT.

The "Odd DCT" (ODCT) extends the length N data block to length $2N-1$, with the middle point of the extended block as a center of even symmetry. The "Even DCT" (EDCT) extends the length N data block to length $2N$, with a center of even symmetry located between the two points nearest the middle. For example, the odd length extension of the sequence A B C is C B A B C, and the even length is C B A A B C. In both cases, the symmetrization eliminates the jumps in the periodic extension of the data block which would occur if one edge of the data block had a high value and the other edge had a low value; in effect it performs a sort of smoothing operation with no loss of information. It will be noted that the terms "odd" and "even" in ODCT and EDCT refer only to the length of the extended data block—in both cases the extended data block has even symmetry.

Both types of DCT may be implemented using compact, high speed, serial-access hardware, in structures similar to those previously described in the prior art for the chirp-z transform (CZT) implementation of the DFT. Reference is specifically directed to two publications authored by R. W. Means, H. J. Whitehouse, J. M. Speiser, *Image Transmission Via Spread Spectrum Techniques*, ARPA Quarterly Technical Report, QR1 and QR2 dated Mar. 1–June 1, 1973, and June 1–Oct. 1, 1973, order Number 2303, Code Number 3G10, published by the Naval Undersea Center, San Diego, California 92132. Reference is also directed to the article entitled Real Time Discrete Fourier Transforms Using Surface Acoustic Wave Devices, authored by Alsup, J. M., Means, R. W., and Whitehouse, H. J., which was presented at the International Specialists Seminar on Component Performance and Systems Applications of Surface Acoustic Wave Devices. The symposium was held Sept. 25–28, 1973, in Aviemore, Scotland. It was organized by the Electronics Division of the (British) Institution of Electrical Engineers. The proceedings were published in 1973, and comprise the IEE Conference Publication No. 109.

The significant difference between the ODCT and EDCT is the block size of the transform which may be implemented using transversal filters having a given limit on the number of taps. A comparison of different high speed implementations of the DCT for a block size of N is given in Table 1.

TABLE 1

| | | | | |
|---|---|---|---|---|
| COMPARISON OF DISCRETE COSINE TRANSFORM IMPLEMENTATIONS | | | | |
| TYPE OF COSINE TRANSFORM | TYPE OF IMPLEMENTATION | FILTER LENGTH | # OF TIMES DATA POINTS ARE READ | #OF OF FILTERS NEEDED |
| Prior Art — ODCT | CZT OF LENGTH 2N-1 USING DEFINITION OF ODCT | 4N-3 | 2 | 1 |
| Prior Art — EDCT | CZT OF LENGTH 2N USING DEFINITION OF EDCT | 4N-1 | 2 | 1 |
| Prior Art — ODCT | FIRST N POINTS OF REAL PART OF CZT OF LENGTH 2N-1 OF N DATA POINTS FOLLOWED BY ZEROS | 2N-1 | 1 | 1 |
| Prior Art — EDCT | FIRST N POINTS OF REAL PART OF CZT OF LENGTH 2N OF N DATA POINTS | 2N-1 | 1 | 1 |

This

TABLE 1-continued

| | COMPARISON OF DISCRETE COSINE TRANSFORM IMPLEMENTATIONS | | | |
|---|---|---|---|---|
| TYPE OF COSINE TRANSFORM | TYPE OF IMPLEMENTATION | FILTER LENGTH | # OF TIMES DATA POINTS ARE READ | #OF OF FILTERS NEEDED |
| invention { EDCT | SWITCHING FILTER DCT | N | 2 | 2 |

Describing the odd discrete cosine transform (ODCT) first, let the data sequence be $g_0, g_1 \ldots g_{N-1}$. Generally, the g terms comprise sampled analog terms, which may be real or imaginary, or possibly complex. However, Eq. (3), hereinbelow, is true only for real input data, and the invention, therefore, assumes real input data. The ODCT of g is defined as $$G_{ok} = \sum_{j=-(N-1)}^{N-1} g_j e^{-\frac{i2\pi jk}{2N-1}}$$

for $k = 0, 1, \ldots, N-1$ (1)

where $g_{-j} = g_j$ for $j = 0, 1, \ldots, N-1$. (2)

By straightforward substitution it may be shown that $$G_{ok} = 2 \, Re \sum_{j=0}^{2N-2} \tilde{g}_j e^{-\frac{i2\pi jk}{2N-1}} = ODCT \quad (3)$$

where $\tilde{g}_j$ is defined by equation (4). In going from Eq. (1) to Eq. (3), complex conjugate pairs of terms have been combined.

$$\tilde{g}_j = \begin{cases} .5 \, g_0, & j = 0 \\ g_j, & j = 1, \ldots, N-1 \\ 0, & j = N, \ldots, 2N-2 \end{cases} \quad (4)$$

The identity (5) applied to Eq. (3), may be used to obtain the CZT form of the ODCT shown in equation (6), and used in the prior art CZT implementation of the ODCT. Equation (6) corresponds to implementing the transform via a complex premultiplication, a complex convolution or filtering, followed by taking the real part of a complex postmultiplication.

$$wjk = w.5 \, k^2 w - .5(k-j)^2 \, w.5 j^2 \quad (5)$$

$$G_{ok} = 2 \, Re \left\{ e^{-\frac{i\pi k^2}{2N-1}} \sum_{j=0}^{2N-2} \left[ e^{-\frac{i\pi j^2}{2N-1}} \tilde{g}_j \right] e^{\frac{i\pi(k-j)^2}{2N-1}} \right\} \quad (6)$$

It is desired to get a chirp-z architecture for rapid implementation of a transform. The basic transform is really defined by Eq. (3), which is an equation for the odd discrete cosine transform (ODCT). However, Eq. (3) is not in a form suitable for obtaining values. It simply says to take twice the real part of some odd discrete cosine transform. What is desired is to replace the product of the data index and the transform index, which in Eq. (3) are j and k, j being the data index and k being the transform index, by terms involving the individual variables or sums and differences of the variables. The result is that there are obtained terms involving a premultiplication, a post-multiplication, and a convolution. All of these operations are easy to implement, and are represented by Eq. (6). The right hand side of Eq. (6) represents, in sequence, a post-multiplication within the square brackets, a convolution involving all terms preceded by the summation sign, followed by a premultiplication by a discrete chirp, involving the leftmost exponential term.

Discussing now the even discrete cosine transform of g, this is defined by equation (7), where the extended sequence is defined by equation (8).

$$G_{ek} = e^{-\frac{i\pi k}{2N}} \sum_{j=-N}^{N-1} g_j e^{-\frac{i2\pi jk}{2N}}$$

for $k = 0, 1, \ldots, N-1$ (7)

$g_{-1-j} = g_j$ for $j = 0, 1, \ldots, N-1$ (8)

If the mutually complex conjugate terms in equation (7) are combined, then equation (9) results. Equation (9) may be viewed as an alternate way of defining the EDCT.

$$G_{ek} = 2 \, Re \left\{ e^{-\frac{i\pi k}{2N}} \sum_{j=0}^{N-1} g_j e^{-\frac{i2\pi jk}{2N}} \right\} = \quad (9)$$

$$2 \sum_{j=0}^{N-1} g_j \cos\left[\frac{2\pi(j+.5)k}{2N}\right]$$

Equation (9) may be put in either of the chirp-z transform (CZT) formats given in equation (10) and (11), where $g_j$ is defined by equation (12).

$$G_{ek} = 2 \, Re \left\{ e^{-\frac{i\pi k}{2N}} e^{-\frac{i\pi k^2}{2N}} \sum_{j=0}^{N-1} \left[ g_j e^{-\frac{i\pi j^2}{2N}} \right] e^{\frac{i\pi(k-j)^2}{2N}} \right\} \quad (10)$$

$$G_{ek} = 2 \, Re \left\{ e^{-\frac{i\pi k}{2N}} e^{-\frac{i\pi k^2}{2N}} \sum_{j=0}^{2N-1} \left[ \tilde{g}_j e^{-\frac{i\pi j^2}{2N}} \right] e^{\frac{i\pi(k-j)^2}{2N}} \right\} \quad (11)$$

$$\tilde{g}_j = \begin{pmatrix} g_j, j = 0, 1, \ldots, N-1 \\ 0, j = N, \ldots, 2N-1 \end{pmatrix} \quad (12)$$

Equations (10) and (12) or (11) and (12) correspond to performing the EDCT via a complex premultiplication, a complex convolution or filtering, followed by taking the real part of a complex postmultiplication. A general DFT of length M, defined by equation (13) may be computed by a CZT defined by equations (14) and (15), as shown in the prior art embodiment 10 of FIG. 1.

$$H_k = \sum_{j=0}^{M-1} h_j e^{-\frac{i2\pi jk}{M}} \quad (13)$$

$$H_k = P_k^* \sum_{j=0}^{M-1} [h_j P_j^*] P_{k-j}, \text{ where } P_k^* \text{ is} \quad (14)$$

the complex conjugate of $P_k$.

Eq. (14) is very similar to Eq. (6) except that it relates to complex terms and is in shorthand notation, with the terms being in the same sequence as in Eq. (6), namely a post-multiplication, a convolution, again preceded by the summation sign, and a premultiplication by a complex discrete chirp.

$$P_s = e^{i\pi s^2/m} = P_{-s} \quad (15)$$

The $P_2$ are defined by Eq. (15). Use of de Moivre's theorem, $e^{i\theta} = \cos\theta + i\sin\theta$ results in a cosine for the real part of $P_s$ and a sine for the imaginary part of $P_s$. Reference to FIG. 6 of the ARPA reference shows how the complex multiplication is accomplished. A complex ROM comprises two real ROM's, one storing values corresponding to the real part and the other storing values corresponding to the imaginary part. The ROM's can be either digital ROM's followed by digital analog converters, or they can also be transversal filters which are impulsed with a delta function, to obtain an analog readout. This is well known in the prior art.

Figure 1:
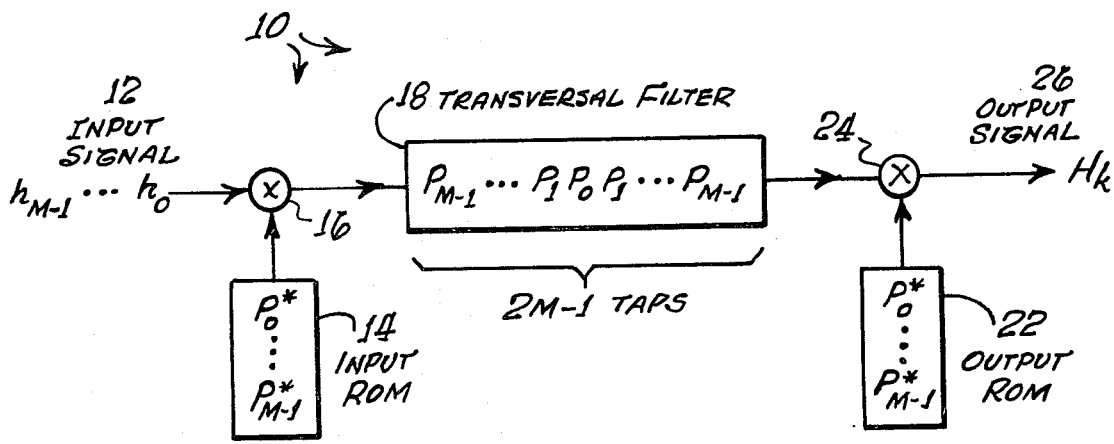
FIG. 1 is a block diagram of a prior art general discrete Fourier transform (DFT) implemented via a chirp-Z transform (CZT) using a transversal filter.

It will be noted that the postmultiplier 22 of FIG. 1 is ready to produce the first transform point when the first term of the input signal 12 to the filter 18 is lined up with the central tap, labelled $P_O$. The first term $H_O$ of the output signal is $$\sum_{n=0}^{N-1} h_n$$

If the ODCT is viewed as a DFT using equation (1), then it may be implemented using the structure 10 shown in FIG. 1 with $M=2N-1$, and the required filter length is $2M-1$, which equals $4N-3$.

The EDCT as defined by equation (7) may be implemented similarly with $M=2N$ by changing the postmultiplier weights to $$e^{-i\pi(k^2+k)/2N}$$

It should be noted that a twofold reduction in the required length of the filter and read-only memories is possible when he ODCT is computed via equation (3) with a CZT used to perform the required DFT. Since only N terms of the input are non-zero, and only N terms of the transversal filter's output are needed, only the first N outputs of the ROMs and the central 2N-1 taps of the transversal filter 10 of FIG. 1 are needed when the ODCT is computed this way. A similar conclusion holds for the EDCT computed via equation (9) with a CZT used to compute the required DFT.

An implementation of the EDCT using switching filters will now be discussed.

The computationally difficult step in the realization of the EDCT via equation (10) is the convolution-like operation shown in Equation (16), corresponding to the summation required in Equation (10). The other operations required in Equation (10) are essentially point-by-point multiplications. The summation, however, is a convolution-like operation and limits the practical transform block size because the signal is perturbed by the taps in the transversal filter.

$$A_k = \sum_{j=0}^{N-1} a_j e^{\frac{i\pi(j-k)^2}{2N}} \quad (16)$$

for $k = 0, 1, \ldots, N-1$

If $P_s$ is defined by equation (15) with $M=2N$, the convolution-like character of equation (16) may be made more explicit as shown in equation (17).

$$A_k = \sum_{j=0}^{N-1} a_j P_{j-k} = \sum_{j=0}^{N-1} a_j P_{k-j} \quad (17)$$

Equation (17) would represent a (periodic) convolution or correlation if the P sequence had period N. In this case, however, the P sequence has period 2N. The essential symmetries of the P sequence are given by equations (18) and (19), using equation (15).

$$P_s = P_{-s} \quad (18)$$

$$P_{N-s} = e^{\frac{i\pi(N^2-2Ns+s^2)}{2N}} = \quad$$

$$(-1)^s e^{\frac{i\pi N}{2}} P_s = (-1)^s e^{\frac{i\pi N}{2}} P_{-s} \quad (19)$$

For specific values of N, equation (19) can be simplified further by using equation (20).

$$e^{\frac{i\pi N}{2}} = \begin{cases} 1, & N \equiv 0 \pmod 4 \\ i, & N \equiv 1 \pmod 4 \\ -1, & N \equiv 2 \pmod 4 \\ -i, & N \equiv 3 \pmod 4 \end{cases} \quad (20)$$

Discussing Eqs. (19) and (20) with respect to FIG. 2, on the first pass of the input signal 32, +1's are read out from the ROM's 36 and 38 into the first and second multipliers, 42 and 44. However, on the second pass, the input signal 32 is premultiplied by the +1's and −1's in ROM's 36 and 38. The two ROM's 36 and 38, store values which correspond to the real and imaginary parts of a number. The first and second multipliers, 42 and 44 multiply real data, namely, the input signal 32, by complex numbers, represented by the values in the ROM's 36 and 38. These complex values are represented by Eqs. (19) and (20).

Eq. (19), provides values for the effective tap weights, after the first N positions, represented in terms of those in the first N positions.

The same result is obtained by operating on the input data signal 32 as would be obtained by changing the values of the tap weights. The filter weights or the number of taps, of course, are not changeable. The necessity for having double-length filter weights is replaced by a time-varying operation on the input data 32. It will be seen that input signal 32 has $N+(N-1)=2N-1$ data points, as have first and second ROM's 36 and 38, since $(N-1)+N$ also equals $2N-1$. Therefore, when switch 52 has shifted $2N-1$ times, the process is completed.

Using only one read-only memory or only one transversal filter would not get the correct values for the transform. The combination of first ROM 36, first multiplier 42, and first transversal filter 46, gives the proper result for the cosine transform terms one half of the times and the combination of second ROM 38, second multiplier 44, and second transversal filter 48, gives the required cosine transform terms the other half of the times. The switch control means 54 ensures that the proper combination is outputted at the correct time.

The initial position of the switch arm 52A would indicate whether the block size of the data is congruent to zero or 2(mod 4). This is so, because for the implementation shown, N was considered to be an even number.

The reason there are four modulo members is to accommodate input data blocks 32 of any length. This is indicated by Eq. (20) in conjunction with Eq. (19). In Eq. (19) The $P_s$ relate to the two discrete chirps. Eq. (19) indicates how the chirp $P_{-s}$ in position $N-s$ is related to the same chirp P in position s, giving $P_s$. It is to be noted that the chirp $P_s$ is multiplied by alternating values of −1's multiplied by a constant $e^{i\pi N/2}$. The value of the constant depends upon the value of N. Mathematically speaking, it depends upon the residue of N modulo-4.

Table 2 shows the weights needed to evaluate (17), where identity (18) has been used to eliminate negative indices. Table 3 shows the same weights after additional simplification, using identities (19) and (20) when N is a multiple of four, to view the weights needed at successive times as modifications of cyclic shifts of $P_0, P_1 \ldots P_{N-1}$. Table 4 shows the weights of Table 3 arranged to correspond to cyclic shifts of the data, corresponding to an implementation using length N transversal filters with data points read twice. Table 5 shows specific values of the exponential term $e^{i\pi k^2/16}$. The left column of complex values gives the real values whereas the right column gives the imaginary values. The values would determine the tap lengths of the taps 144, 152, 164 and 172 shown in FIG. 6.

TABLE 2

WEIGHTS REQUIRED FOR THE CORRELATION-LIKE OPERATION IN THE EDCT, ORDERED FOR FIXED DATA POSITION.

| SHIFT INDEX j | WEIGHT SET $P_{k-j} = P_{j-k}$ | | | | | |
|---|---|---|---|---|---|---|
| 0 | $P_{N-1}$ | | | | $P_1$ | $P_0$ |
| 1 | $P_{N-2}$ | | | $P_1$ | $P_0$ | $P_1$ |
| 2 | $P_{N-3}$ | | $P_2$ | $P_0$ | $P_1$ | $P_2$ |
| N−1 | $P_0$ | $P_1$ | $P_2$ | | $P_1$ | $P_{N-1}$ |

TABLE 3

REDUCED FORM OF THE WEIGHTS REQUIRED FOR THE CORRELATION-LIKE OPERATION IN THE EDCT WHEN N = 0 (MOD 4), ORDERED FOR FIXED DATA POSITION.
(Same as Table 2 after using identities (18) and (19))

| SHIFT INDEX | WEIGHT SET | | | | | |
|---|---|---|---|---|---|---|
| 0 | $P_{N-1}\ldots$ | | | | $P_1$ | $P_0$ |
| 1 | $P_{N-2}\ldots$ | | | $P_1$ | $P_0$ | $-P_{N-1}$ |
| 2 | $P_{N-3}\ldots$ | | $P_1$ | $P_0$ | $-P_{N-1}$ | $P_{N-2}$ |
| 3 | $P_{N-4}\ldots$ | $P_1$ | $P_0$ | $-P_{N-1}$ | $P_{N-2}$ | $-P_{N-3}$ |
| k | $P_{N-k-1}\ldots P_1$ | $P_0\ldots\pm\ldots$ | | $(-1)^{k-1}P_{N-k+1}$ | $(-1)^k P_{N-k}$ | |

TABLE 4

WEIGHTS REQUIRED FOR THE CORRELATION-LIKE OPERATION IN THE EDCT WHEN N is a multiple of 4 ORDERED FOR CYCLICALLY SHIFTING DATA.

| SHIFT INDEX | WEIGHT SET ← TAP POSITION | | | | |
|---|---|---|---|---|---|
| 0 | $P_{N-1}\ldots$ | | | $P_1$ | $P_0$ |
| 1 | $-P_{N-1}$ | $P_{N-2}$ | | $P_1$ | $P_0$ |
| 2 | $-P_{N-1}$ | $P_{N-2}$ | $P_{N-3}\ldots$ | $P_1$ | $P_0$ |
| 3 | $-P_{N-1}$ | $P_{N-2}$ | $-P_{N-3}\ldots$ | $P_1$ | $P_0$ |
| TIME ↓ | | | | | |

TABLE 5

Filter tap weights for transversal filter derived from relationship $e^{\frac{i\pi k^2}{16}}$.

| INDEX K | COMPLEX | VALUE |
|---|---|---|
| 0 | 1.000 | .000 |
| 1 | .981 | .195 |
| 2 | .707 | .707 |
| 3 | −.195 | .981 |
| 4 | −1.000 | .000 |
| 5 | .195 | −.981 |
| 6 | .707 | .707 |
| 7 | −.981 | −.195 |
| 8 | 1.000 | −.000 |
| 9 | −.981 | −.195 |
| 10 | .707 | .707 |
| 11 | .195 | −.981 |
| 12 | −1.000 | .000 |
| 13 | −.195 | .981 |
| 14 | .707 | .707 |
| 15 | .981 | .195 |

The required time-variant operations may be moved out of the filters as shown in FIG. 2.

A complete EDCT structure using the switching filter is shown in FIG. 3. The switch changes position with every data shift, and its initial position is determined by whether the block size is congruent to zero or to two modulo four. A similar structure may be used for block sizes congruent to one or three modulo four, except that the ROM 1 and the ROM 2 will contain $\pm i$ entries instead of $\pm 1$'s. Because of the simple structure of the output needed from ROM 1 and ROM 2 it may be preferable to replace them with a combination of a counter and gates to generate the required functions.

Referring now to FIG. 4, this figure shows an apparatus 100 which serves the same function as a read-only memory and its corresponding multiplier, for example, in FIG. 2, first ROM 36 and first multiplier 42, and in FIG. 3, second ROM 68 and second multiplier 74.

FIG. 5 shows an alternative embodiment 120 similar to that shown in FIGS. 2 and 3. A switch 130 has its switch arms 132 controlled by the bits in the ROM 122. For example, a 1 in the ROM may cause the switch arms 132 to close, causing an input sample at input 124 to be transmitted, by transformer 126, to the output 128.

FIG. 6 is a block diagram of a prior art transversal filter 140, of the type shown in FIGS. 1, 2 and 3.

In conclusion, the three general types of DCT implementations using transversal filters and multipliers each possess unique advantages. A DCT implementation using a complete CZT will use transversal filters with tap weightings which should become standard components in the near future. An implementation using shortened versions of the filters and ROMs needed for a standard CZT permits a longer block length transform to be implemented for a given number of taps per filter, and simultaneously eliminates the need to rescan data points. A new structure called the "switching filter EDCT" permits a further increase in block size for a given filter length, but requires more filters, some additional switching circuitry, and a rescan of the data. The switching filter implementation of the EDCT uses transversal filters each having a number of taps equal to the transform block length. The other implementations require nearly twice as many and four times as many taps per filter.

Obviously, many modifications and variations of the present invention are possible in the light of the above teachings. It is therefore to be understood that within the scope of the appended claims the invention may be practiced otherwise than as specifically described.

What is claimed is:

1. Apparatus for performing a modified circular convolution useful for performing the discrete cosine transform of an input signal having N samples, comprising;
   two read-only memories, each containing a total number equal to 2N−1 of +1's and −1's arranged in a predetermined manner;
   two multipliers, each having an input from one of the read-only memories, and another, common, input to be connected to the input signal which is to be transformed discretely and cosinusoidally;
   two transversal filters, each having N taps, the input to each filter being the output of one of the multipliers; and
   a single-pole double-throw switch means, comprising a switch arm and two free terminals, the switch arm comprising the output of the transform apparatus, each of the free terminals being connected to the output of one of the transversal filters; and
   means connected to the switch for causing the switch arm to be connected alternately first to one free terminal and then to the other, until all the required input bits have been transformed cosinusoidally.

2. The apparatus according to claim 1, further comprising:
   means connected to the read-only memories, multipliers, filters, and the switch means, for controlling the timing or sequencing of these circuits.

3. The apparatus according to claim 2, wherein:
   one of the read-only memories discharges first an N number of +1's and then an N−1 number of alternating ±1's, beginning with a +1; and
   the other read-only memory discharges first an N number of +1's and then an N−1 number of alternating ±1's, beginning with a −1.

4. Apparatus for performing a discrete cosine transform of an input signal, having N samples, comprising:
   a first read-only memory which has stored within it data samples corresponding to $e^{-i\pi j^2/2N}$, j=0, 1 ... N−1;
   a first multiplier whose two inputs comprise an input signal $g_{N-2} \ldots g_1 g_0 \ldots g_{N-1} \ldots g_1 g_0$ and the output of the first read-only memory;
   second and third read-only memories, each containing a predetermined number of +1's and −1's arranged in a predetermined manner;
   second and third multipliers, each having two inputs, one input of each being connected to the output of the first multiplier, the other inputs being connected to the outputs of the second and third read-only memories, respectively;
   first and second transversal filters, each having N taps, the input to each filter being the output of the second and third multipliers, respectively; and
   a single-pole double-throw switch, comprising a switch arm and two free terminals, each of the free terminals being connected to the output of one of the transversal filters;
   means connected to the switch for causing the switch arm to be connected alternately first to one free terminal and then to the other until all of the required input signal bits are processed;
   a fourth read-only memory which has stored within it reference samples corresponding to $e^{-i\pi(k^2+k)/2N}$, k=0, 1 ... N−1;
   a fourth multiplier, one of whose outputs is connected to the switch arm, the other input being connected to the output of the fourth read-only memory; and
   means connected to the output signal of the fourth multiplier, for taking the real part of the signal, which comprises the discrete cosine transform of the input signal.

* * * * *